United States Patent
Mairov et al.

(10) Patent No.: US 11,598,633 B2
(45) Date of Patent: Mar. 7, 2023

(54) ANALYZING A BURIED LAYER OF A SAMPLE

(71) Applicant: Applied Materials Israel Ltd., Rehovot (IL)

(72) Inventors: Alexander Mairov, Herzlyiah (IL); Gal Bruner, Kibutz Kabri (IL); Yehuda Zur, Tel-Aviv (IL)

(73) Assignee: Applied Materials Israel Ltd., Rehovot (IL)

( * ) Notice: Subject to any disclaimer, the term of this patent is extended or adjusted under 35 U.S.C. 154(b) by 87 days.

(21) Appl. No.: 17/378,999

(22) Filed: Jul. 19, 2021

(65) Prior Publication Data

US 2023/0019567 A1 Jan. 19, 2023

(51) Int. Cl.
*G01B 15/02* (2006.01)
*H01J 37/302* (2006.01)
*H01J 37/304* (2006.01)

(52) U.S. Cl.
CPC ............ *G01B 15/02* (2013.01); *H01J 37/302* (2013.01); *H01J 37/3045* (2013.01)

(58) Field of Classification Search
CPC ...... G01B 15/02; H01J 37/302; H01J 37/3045
USPC ................................................. 250/307, 306
See application file for complete search history.

(56) References Cited

U.S. PATENT DOCUMENTS

| | | | |
|---|---|---|---|
| 5,443,684 A | 8/1995 | Eckart et al. | |
| 6,670,610 B2 | 12/2003 | Shemesh et al. | |
| 7,518,109 B2 * | 4/2009 | Ikku | G01B 15/02 |
| | | | 250/311 |
| 8,709,269 B2 | 4/2014 | Shemesh | |
| 9,046,475 B2 | 6/2015 | Langer et al. | |
| 10,204,762 B2 | 2/2019 | Fuller et al. | |
| 10,217,621 B2 | 2/2019 | Ruach-Nir et al. | |
| 2002/0074494 A1 | 6/2002 | Lundquist et al. | |
| 2005/0100205 A1 | 5/2005 | Shishido et al. | |
| 2005/0173631 A1 | 8/2005 | Ray et al. | |

(Continued)

FOREIGN PATENT DOCUMENTS

| | | |
|---|---|---|
| KR | 10-2009-0091157 A | 8/2009 |
| WO | 2020/237105 A1 | 11/2020 |

OTHER PUBLICATIONS

Hill et al., "FIB Endpoint Detection and Depth Resolution," Microelectronic Engineering 21, 1993, pp. 201-204.

(Continued)

*Primary Examiner* — Kiet T Nguyen
(74) *Attorney, Agent, or Firm* — Kilpatrick Townsend & Stockton LLP

(57) ABSTRACT

Analyzing a buried layer on a sample includes milling a spot on the sample using a charged particle beam of a focused ion beam (FIB) column to expose the buried layer along a sidewall of the spot. From a first perspective a first distance is measured between a first point on the sidewall corresponding to an upper surface of the buried layer and a second point on the sidewall corresponding to a lower surface of the buried layer. From a second perspective a second distance is measured between the first point on the sidewall corresponding to the upper surface of the buried layer and the second point on the sidewall corresponding to the lower surface of the buried layer. A thickness of the buried layer is determined using the first distance and the second distance.

20 Claims, 11 Drawing Sheets

(56) References Cited

U.S. PATENT DOCUMENTS

2012/0326028 A1* 12/2012 Muto .................... H01J 37/244
                                                        250/307
2018/0005906 A1    1/2018  Sagawa et al.
2019/0170509 A1    6/2019  Kawada
2020/0013603 A1    1/2020  Ruach-Nir et al.

OTHER PUBLICATIONS

U.S. Appl. No. 17/011,955 Notice of Allowance dated Sep. 9, 2021, 9 pages.
International Search Report and Written Opinion for Application No. PCT/US2022/035227, dated Oct. 13, 2022, 11 pages.
International Search Report and Written Opinion for Application No. PCT/US2022/038945, dated Nov. 16, 2022, 9 pages.

* cited by examiner

ANALYZING A BURIED LAYER OF A SAMPLE

BACKGROUND

In the study of electronic materials and processes for fabricating such materials into an electronic structure, a specimen of the electronic structure can be used for microscopic examination for purposes of failure analysis and device validation. For instance, a specimen such as a silicon wafer that includes one or more electronic structures formed thereon can be milled with a focused ion beam (FIB) and analyzed to study specific characteristics of the structures formed on the wafer.

Many modern electronic structures include different alternating layers of material in one or more portions of the structure. Important characteristics of these layers include composition and thickness. To determine thickness, specimens can be milled with a FIB, and layer thickness can be determined using, for example, optical microscopy, transmission electron microscopy (TEM), or scanning electron microscopy (SEM) techniques. These techniques can provide accurate thickness measurements, but they generally require the specimen to be carefully milled with a FIB to provide a vertical cross-section so that the measurements can be performed. This milling step can be time consuming.

Improved methods for measuring thickness of buried layers on specimens are desired.

SUMMARY

Embodiments described herein provide improved systems and methods for measuring thickness of buried layers on specimens. Some embodiments can reduce measurement or analysis time and/or may be performed in-line during sample fabrication. In some embodiments, a spot is milled on a specimen or sample using a FIB to expose a buried layer along the sidewall. The spot may be milled to have a Gaussian shape with sloped sidewalls. The spot can be milled relatively quickly compared to milling the vertical cross-section used for conventional optical and SEM techniques. Images of the buried layer along the sidewall may be obtained from two different perspectives, and using the images, the thickness of the buried layer may be determined as described herein.

In accordance with an embodiment, an inspection system for analyzing a buried layer of a sample includes a FIB column, a SEM column, and a computer readable medium comprising instructions that when executed cause the inspection system to perform steps comprising: milling a spot on the sample using a charged particle beam of the FIB column to expose the buried layer along a sidewall of the spot, wherein after the milling the sidewall of the spot is sloped; obtaining a first image of the sidewall of the spot using the SEM column, the first image obtained from a first perspective associated with a first angle relative to a surface of the sample; measuring, using the SEM column, a first distance between a first point on the sidewall corresponding to an upper surface of the buried layer and a second point on the sidewall corresponding to a lower surface of the buried layer, wherein the first distance is projected onto a horizontal plane or a vertical plane; obtaining a second image of the sidewall of the spot using the SEM column, the second image obtained from a second perspective associated with a second angle relative to the surface of the sample; measuring, using the SEM column, a second distance between the first point on the sidewall corresponding to the upper surface of the buried layer and the second point on the sidewall corresponding to the lower surface of the buried layer, wherein the second distance is projected onto the horizontal plane or the vertical plane, and the first point and the second point fall approximately on a line extending vertically through the buried layer; and determining a thickness of the buried layer using the first angle, the first distance, the second angle, and the second distance.

In an embodiment, the first angle is approximately normal to the surface of the sample, and the second angle is approximately 45° to the surface of the sample.

In one embodiment, the computer readable medium further comprises instructions that when executed cause the inspection system to mill the spot with the charged particle beam in a focused mode. In another embodiment, the computer readable medium further comprises instructions that when executed cause the inspection system to mill the spot with the charged particle beam in a de-focused mode.

In another embodiment, the computer readable medium further comprises instructions that when executed cause the inspection system to mill the spot without scanning the charged particle beam.

In accordance with another embodiment, for example, a method of determining a thickness of a buried layer on a sample includes milling a spot on the sample using a charged particle beam of a FIB system to expose the buried layer along a sidewall of the spot, wherein after the milling the sidewall of the spot is sloped; measuring, from a first perspective approximately normal to a surface of the sample, a first distance between a first point on the sidewall corresponding to an upper surface of the buried layer and a second point on the sidewall corresponding to a lower surface of the buried layer; measuring, from a second perspective approximately 45° to the surface of the sample, a second distance between the first point on the sidewall corresponding to the upper surface of the buried layer and the second point on the sidewall corresponding to the lower surface of the buried layer, wherein the first point and the second point fall approximately on a line extending vertically through the buried layer; and determining the thickness of the buried layer using the first distance and the second distance.

In an embodiment, the thickness of the buried layer is a vertical distance between the upper surface of the buried layer and the lower surface of the buried layer.

In another embodiment, the first distance is measured using a first image of the sidewall and the second distance is measured using a second image of the sidewall.

In another embodiment, the line extending vertically through the buried layer is approximately normal to the upper surface of the buried layer or the lower surface of the buried layer.

In some embodiments, the spot is milled with the charged particle beam in a focused mode, while in other embodiments, the spot is milled with the charged particle beam in a de-focused mode.

In another embodiment, the spot is milled without scanning the charged particle beam.

In another embodiment, the charged particle beam is generated using a plasma xenon source.

In another embodiment, the buried layer on the sample underlies an overlying layer on the sample.

In yet another embodiment, the sample is a semiconductor wafer.

In accordance with another embodiment, for example, a method of determining a thickness of a buried layer on a sample includes milling a spot on the sample using a charged particle beam of a FIB system to expose the buried layer along a sidewall of the spot, wherein the spot is milled without scanning the charged particle beam, and after the milling, the sidewall of the spot is sloped; obtaining a first image of the sidewall of the spot, the first image obtained from a first perspective associated with a first angle relative to the sample; measuring, using the first image, a first distance between a first point on the sidewall corresponding to an upper surface of the buried layer and a second point on the sidewall corresponding to a lower surface of the buried layer; obtaining a second image of the sidewall of the spot, the second image obtained from a second perspective associated with a second angle relative to the sample, wherein the first angle and first perspective are different from the second angle and the second perspective; measuring, using the second image, a second distance between the first point on the sidewall corresponding to the upper surface of the buried layer and the second point on the sidewall corresponding to the lower surface of the buried layer, wherein the first point and the second point fall approximately on a line extending vertically through the buried layer; and determining the thickness of the buried layer using the first distance, the first angle associated with the first perspective, the second distance, and the second angle associated with the second perspective.

In an embodiment, the first angle associated with the first perspective and the second angle associated with the second perspective are relative to a surface of the sample.

In another embodiment, the first image and the second image are obtained using a scanning electron microscopy technique.

In another embodiment, the first distance and the second distance are projected onto a horizontal plane or a vertical plane.

In yet another embodiment, the method also includes monitoring a fabrication process using the thickness of the buried layer.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function and purpose.

DETAILED DESCRIPTION

Embodiments described herein provide methods for determining thickness of buried layers on specimens. The methods involve milling a spot on a sample to expose the buried layer along the sidewall. Images of the buried layer are obtained from different perspectives, and the thickness of the buried layer is determined using the images.

Figure 1A:
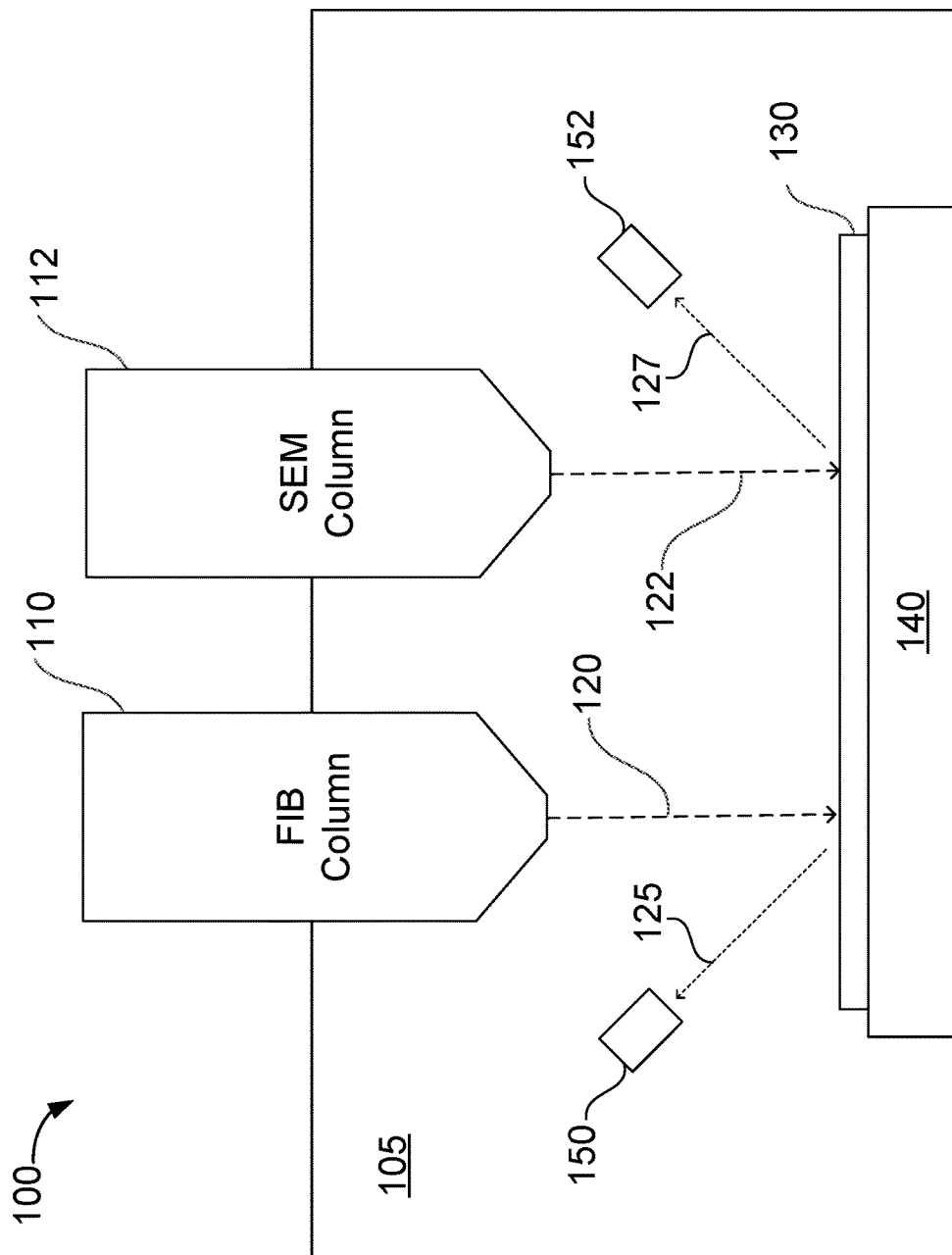
FIGS. 1a-1b are simplified illustrations of an exemplary inspection system according to some embodiments.
Figure 1B:
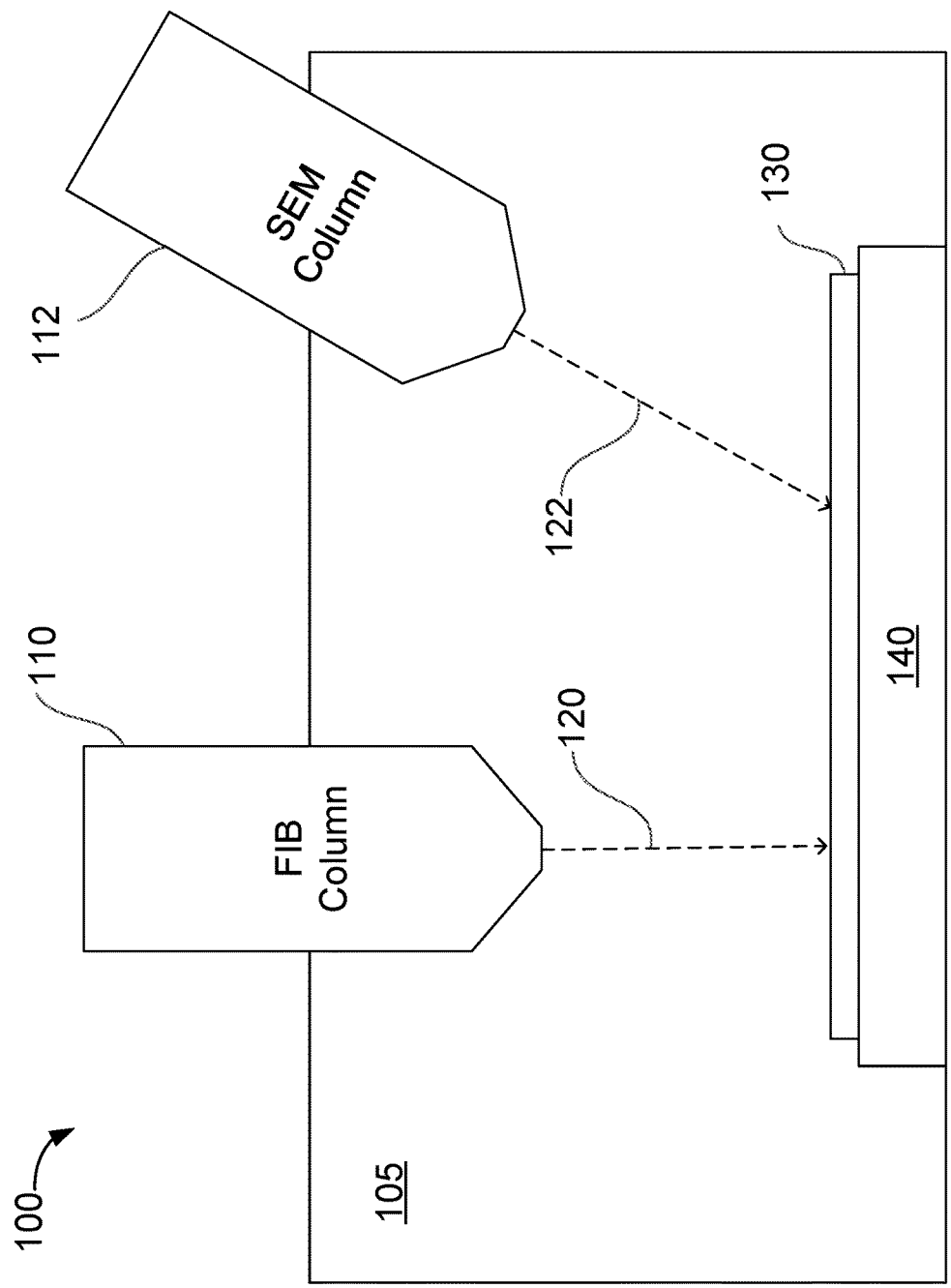

In order to better understand and appreciate the disclosure, reference is first made to FIGS. 1a-1b, which are simplified schematic illustrations of an exemplary inspection system 100 according to some embodiments of the disclosure. Inspection system 100 can be used for, among other operations, defect review and analysis of structures formed on semiconductor wafers.

As shown in FIG. 1a, system 100 can include, among other elements, a FIB column 110, a SEM column 112, a sample supporting element 140, and optionally secondary electron detectors 150, 152 (or in some embodiments, secondary ion detectors, or a combination of the two detectors working in parallel). FIB column 110 is operable to generate a charged particle beam 120 and direct the charged particle beam 120 towards a sample 130 (sometimes referred to herein as an "object" or a "specimen") to mill or otherwise process the sample. SEM column 112 can generate an image of a portion of sample 130 by illuminating the sample with a charged particle beam, detecting particles emitted due to the illumination, and generating charged particle images based on the detected particles. The sample, for example a semiconductor wafer, can be supported on the sample supporting element 140 within a vacuum chamber 105. Supporting element 140 can also move the sample within vacuum chamber 105 between the field of view of the two columns 110 and 112 as required for processing. For example, the FIB column 110 may be used to mill the sample 130, and the supporting element 140 may move the sample so that the SEM column 112 can image the milled portion of the sample 130.

The FIB column 110 can mill (e.g., remove portions of) the sample 130 by irradiating the sample 130 with the charged particle beam 120. A FIB milling process typically operates by positioning the specimen in a vacuum chamber 105 and emitting a focused beam of ions towards the specimen to etch or mill away material on the specimen. Common milling processes form a cross section of the sample 130 and, if desired, can also smooth the cross section. In some instances, the vacuum environment can be purged with background gases that serve to control the etch speed and other parameters. The accelerated ions can be generated from Xenon, Gallium or other appropriate elements and are typically accelerated towards the specimen by voltages in the range of 500 volts to 100,000 volts, and more typically falling in the range of 3,000 volts to 30,000 volts. The beam current is typically in the range from several pico amps to several micro amps, depending on the FIB instrument configuration and the particular application, and the pressure is typically controlled between $10^{-10}$ to $10^{-5}$ mbar in different parts of the system and in different operation modes.

As used with the embodiments described herein, the milling process may form a recess or spot on the sample 130. The spot may be formed by milling the sample 130 without scanning the charged particle beam 120. The spot may be on the order of a few hundreds of nanometers to a few hundreds of microns in lateral dimensions.

During a milling operation, the charged particle beam 120 generated by the FIB column 110 propagates through a vacuum environment formed within vacuum chamber 105 before impinging on the sample 130. Secondary electrons and ions 125 are generated in the collision of ions with the sample and are detected by the detector 150. The detected secondary electrons or ions 125 can be used to analyze characteristics of the milled layers and the structure and/or can be used to determine an endpoint of a milling process.

During a particle imaging operation, the charged particle beam 122 generated by the SEM column 112 propagates through the vacuum environment formed within the vacuum chamber 105 before impinging on the sample 130. Secondary electrons and ions 127 are generated in the collision of ions with the sample and are detected by the detector 152. The detected secondary electrons or ions 127 can be used to form images of the milled area and/or to analyze characteristics of the milled layers and the structure.

FIG. 1B shows the inspection system 100 with the SEM column 112 tilted. As explained more fully below, the SEM column 112 may be tilted relative to a surface of the sample 130 to obtain images from a different perspective. Alternatively, the supporting element 140 may be configured to tilt the sample 130 so that images can be obtained from a different perspective. The detectors 150, 152 are not shown in FIG. 1B for ease of illustration.

While not shown in FIGS. 1*a*-1*b*, the inspection system 100 can include a number of additional components including, but not limited to, one or more gas nozzles to deliver process gases to the vacuum chamber 105, vacuum and other valves to control the pressure within the vacuum chamber 105, and one or more lenses to direct the charged particle beam 120, among other components. System 100 can also include one or more controllers, processors or other hardware units that control operation of the system 100 by executing computer instructions stored in one or more computer-readable memories as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

The inspection system 100 shown in FIGS. 1*a*-1*b* is provided as an example of a system that may be used with some of the embodiments described herein. It should be appreciated that the embodiments are not limited to the inspection system 100, and other inspection systems may be used with some embodiments. Also, in some embodiments, a FIB tool may be used to mill a spot on a sample, and a separate SEM tool may be used to obtain images of the spot.

Figure 2:
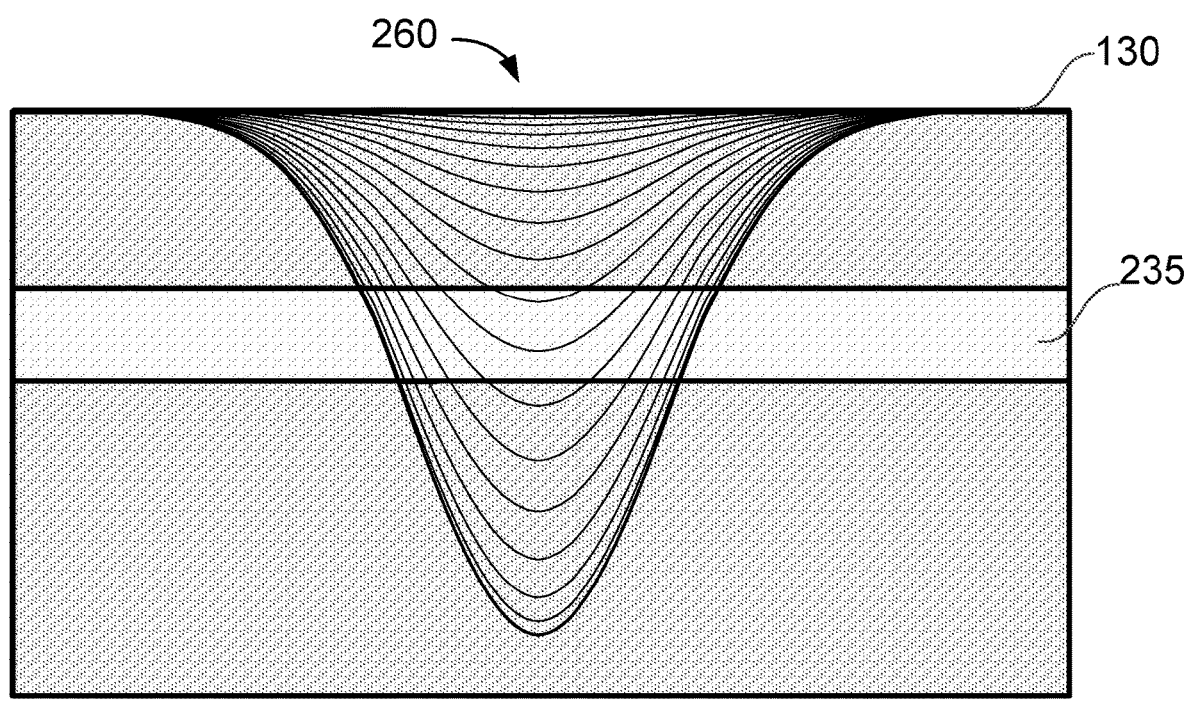
FIG. 2 is a simplified cross-sectional view of a spot milled on a specimen or sample using a charged particle beam of a FIB system according to an embodiment.

FIG. 2 is a simplified cross-sectional view of a spot 260 milled on a sample 130 using a charged particle beam of a FIB system according to an embodiment. The spot 260 is a Gaussian-shaped recess in the sample 130 so that the spot 260 has sloped sidewalls. In some embodiments, the spot 260 may be formed using a Gaussian-shaped charged particle beam, and the spot 260 may be formed without scanning the charged particle beam across the sample 130. The spot 260 may be formed using a focused or de-focused charged particle beam.

In the example of FIG. 2, the sample 130 includes a buried layer 235. The buried layer 235 may have a different composition or structure than adjacent layers in the sample 130. Although only a single buried layer 235 is shown in this example, the sample 130 may include multiple layers formed on a substrate in other embodiments (e.g., multiple thin film layers on a semiconductor wafer).

Figure 3:
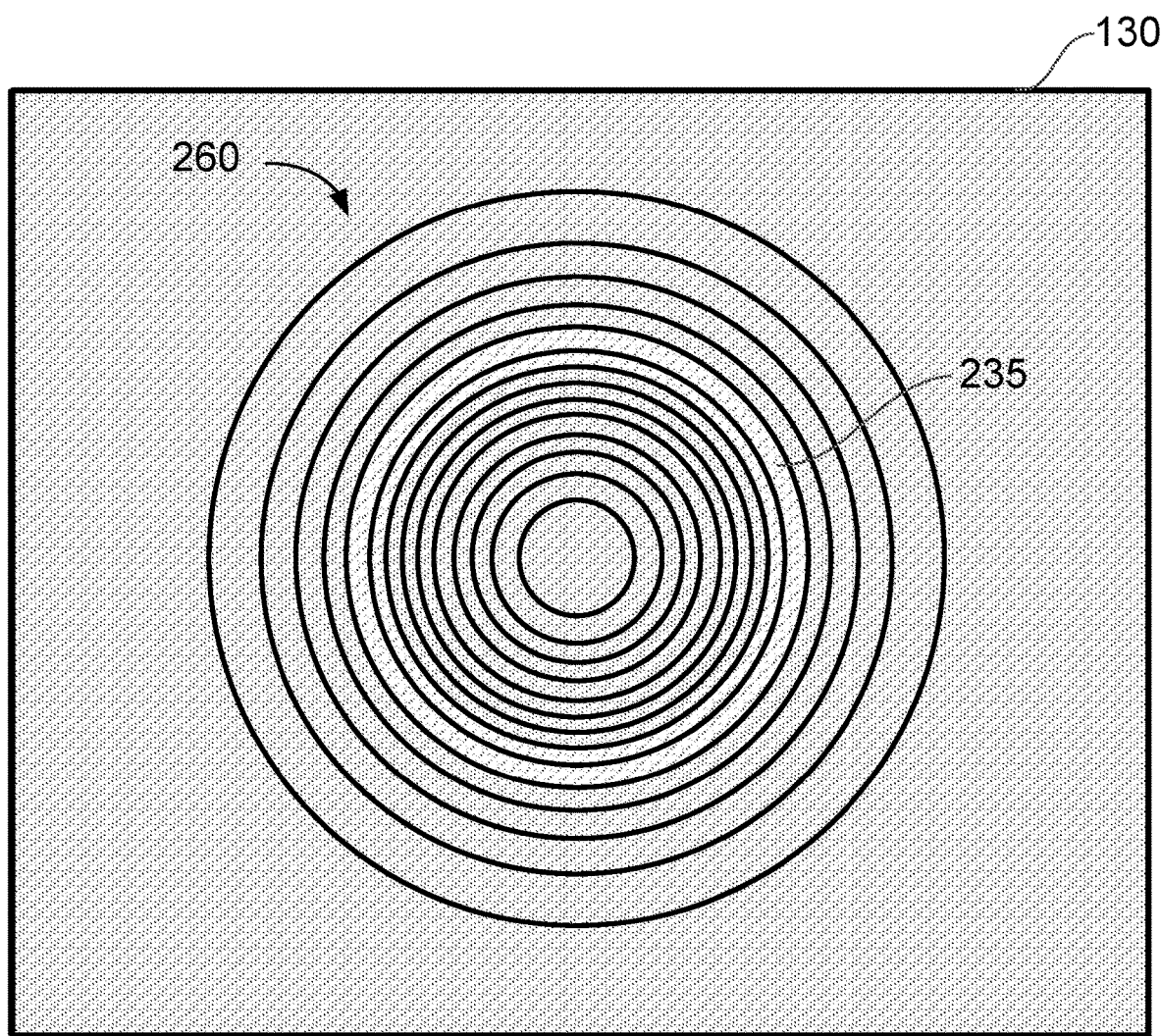
FIG. 3 is a simplified illustration of the spot shown in FIG. 2 from a top-down perspective according to an embodiment.

FIG. 3 is a simplified illustration of the spot 260 shown in FIG. 2 from a top-down perspective according to an embodiment. From this perspective, the buried layer 235 can be seen along the sloped sidewall of the spot 260. In some embodiments, the top-down perspective may be approximately normal to a surface of the sample 130 (e.g., within a few degrees).

Figure 4:
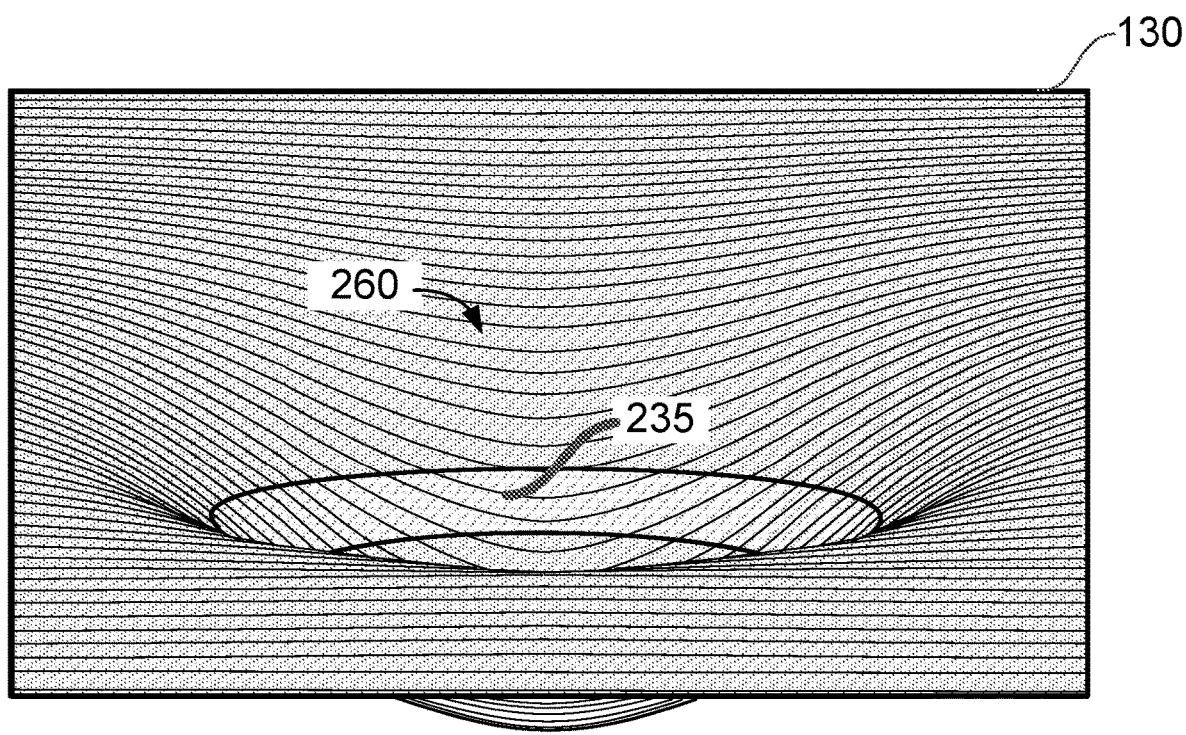
FIG. 4 is a simplified illustration of the spot shown in FIG. 2 from a tilted perspective according to an embodiment.

FIG. 4 is a simplified illustration of the spot shown in FIG. 2 from a tilted perspective according to an embodiment. From this perspective, the buried layer 235 can be seen along the sloped sidewall of the spot 260. In some embodiments, the tilted perspective may be approximately 45° to a surface of the sample 130 (e.g., within a few degrees).

Although FIGS. 2-4 are not intended to be drawn to scale or even use the same scale, they are intended to illustrate that an apparent thickness of the buried layer 235, as indicated by a distance between a top surface of the buried layer 235 and a bottom surface of the buried layer 235, varies depending on the perspective from which the buried layer 235 is viewed. More specifically, a distance between the top and bottom surfaces of the buried layer 235 increases as a tilt of the perspective increases, reaching a maximum at a particular tilt that depends on the slope of the sidewall, and then decreasing with further increases in the tilt. This is shown in FIGS. 3-4, where the distance increases between the top-down perspective of FIG. 3 and the tilted perspective of FIG. 4.

Figure 5:
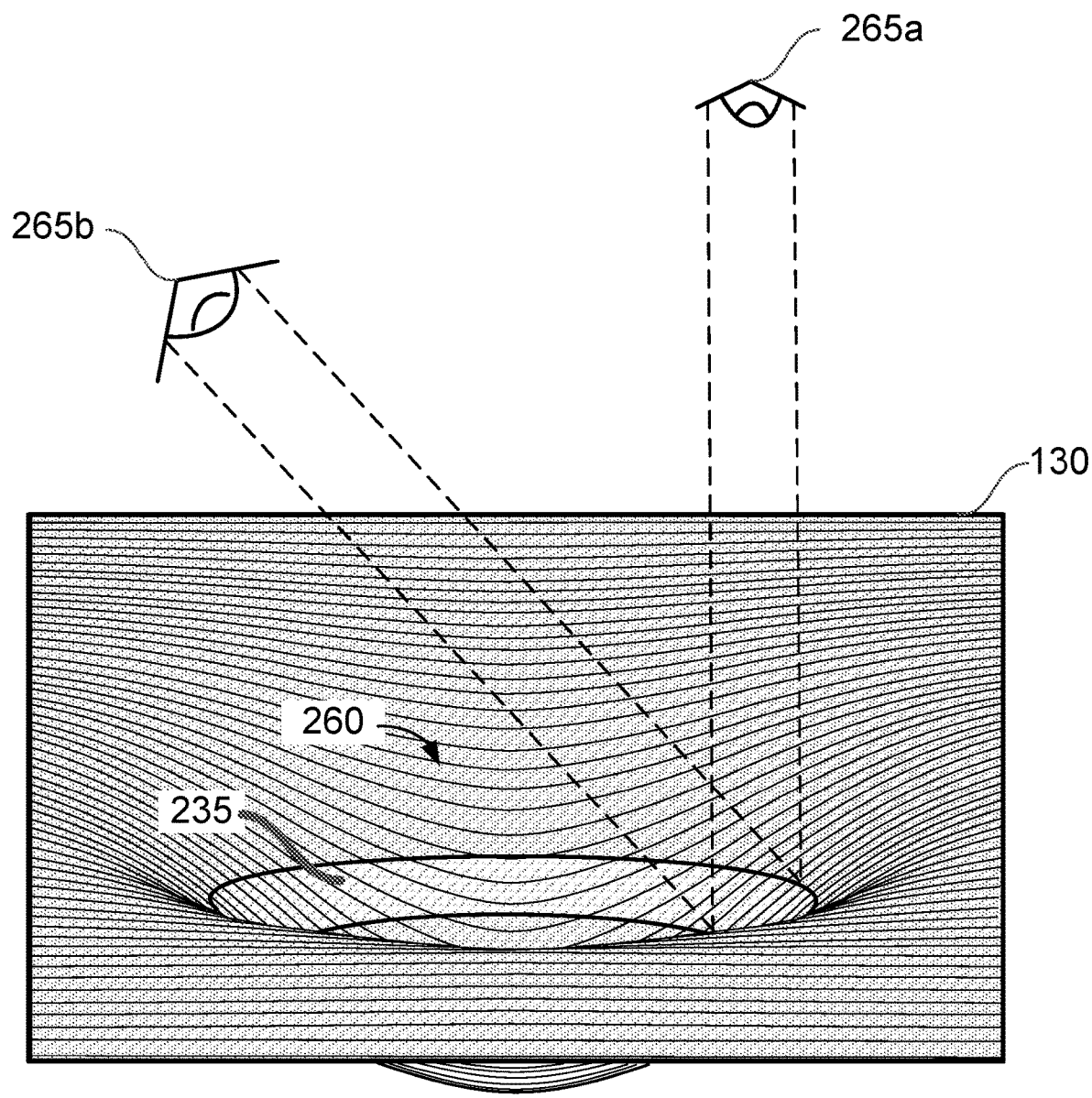
FIG. 5 is a simplified diagram illustrating how images of a buried layer on a sidewall of a spot can be obtained from different perspectives according to an embodiment.

In accordance with some embodiments, a thickness of the buried layer 235 (a vertical thickness) may be determined using distances measured between the top and bottom surfaces of the buried layer 235 as viewed from different perspectives. FIG. 5 is a simplified diagram illustrating how images of a buried layer 235 on a sidewall of a spot 260 can be obtained from different perspectives according to an embodiment. In this example, a first image may be obtained from a first perspective 265*a*, and a second image may be obtained from a second perspective 265*b*. The images may be obtained using any type of imaging device or technique that allows distance measurements to be obtained between points in the images. Examples include optical or SEM devices and techniques. Distances between points on the upper and lower surfaces of the buried layer 235 can be measured using the images. It should be appreciated that a field of view of the imaging device may include a larger portion of the spot 260 or the sample 130 than just the buried layer 235.

Figure 6A:
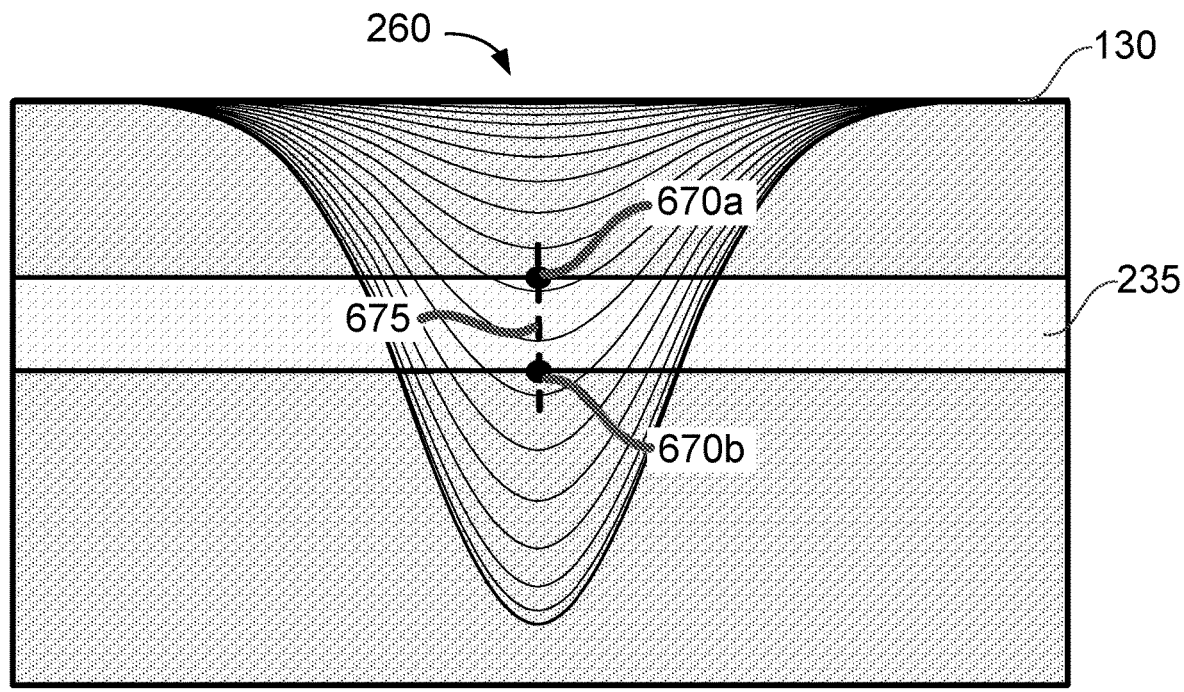
FIGS. 6a-6b are simplified cross-sectional views of a spot milled on a sample showing points on upper and lower surfaces of a buried layer according to some embodiments.
Figure 6B:
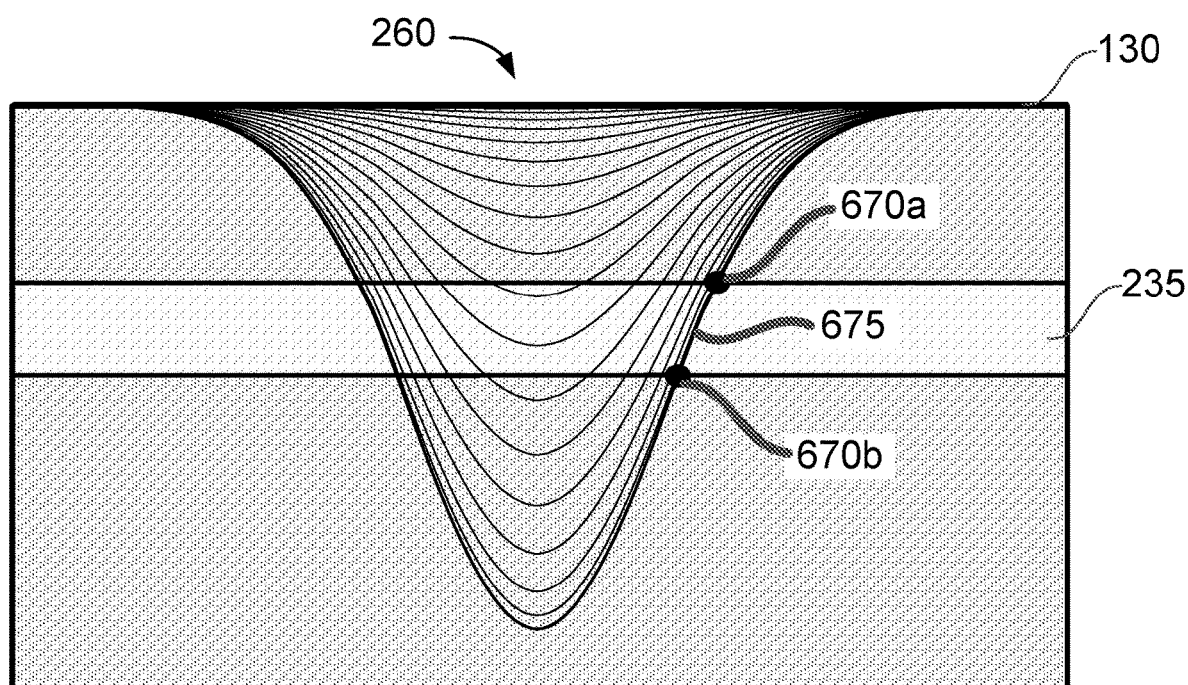

FIGS. 6*a*-6*b* are simplified cross-sectional views of a spot 260 milled on a sample 130 showing point 670*a* on an upper surface of the buried layer 235 and point 670*b* on a lower surface of the buried layer 235 according to some embodiments. The points 670*a*, 670*b* are typically at locations that have some feature or features that makes the points 670*a*, 670*b* identifiable in the images obtained from the different perspectives.

In FIG. 6*a*, the spots 670*a*, 670*b* appear to be aligned vertically. However, FIG. 6*b* is rotated 90° relative to FIG.

6a and shows that the points 670a, 670b are offset vertically since they are located on the sloped sidewall of the spot 260. Although they are offset vertically, the points 670a, 670b are directly above and below each other along the sloped sidewall so that the points 670a, 670b fall approximately on a line 675 extending vertically through the buried layer 235 as shown in FIG. 6a.

In practice, one of the points may be chosen, for example point 670a, and distances may be measured between the point 670a and other points at the lower surface of the buried layer 235 that appear to be directly below the point 670a. The point associated with the shortest distance may be identified as the point 670b. This should provide two points that fall approximately on a line 675 extending vertically through the buried layer 235 as shown in FIG. 6a.

Figure 7:
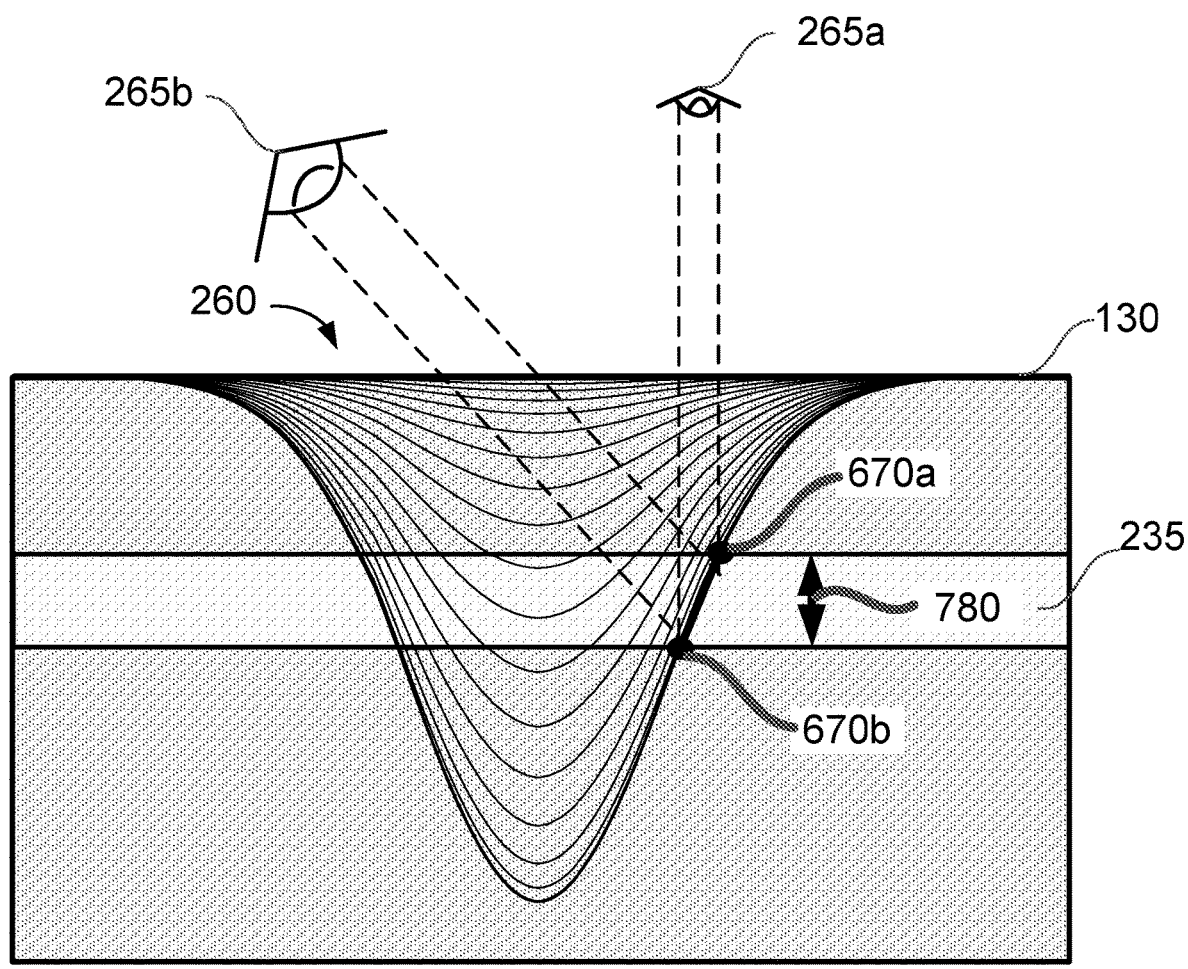
FIG. 7 is a simplified diagram illustrating some of the steps for determining a vertical thickness of a buried layer using measured distances between points on upper and lower surfaces of the buried layer according to an embodiment.

FIG. 7 is a simplified diagram illustrating some of the steps for determining a vertical thickness 780 of a buried layer 235 using measured distances between points 670a, 670b according to an embodiment. In this example, a first image of the buried layer 235 is obtained from a first perspective 265a, and a second image of the buried layer 235 is obtained from a second perspective 265b. A distance between the points 670a, 670b in each image can be determined using known measurement techniques dependent on the particular imaging device and measurement technique.

Figure 8:
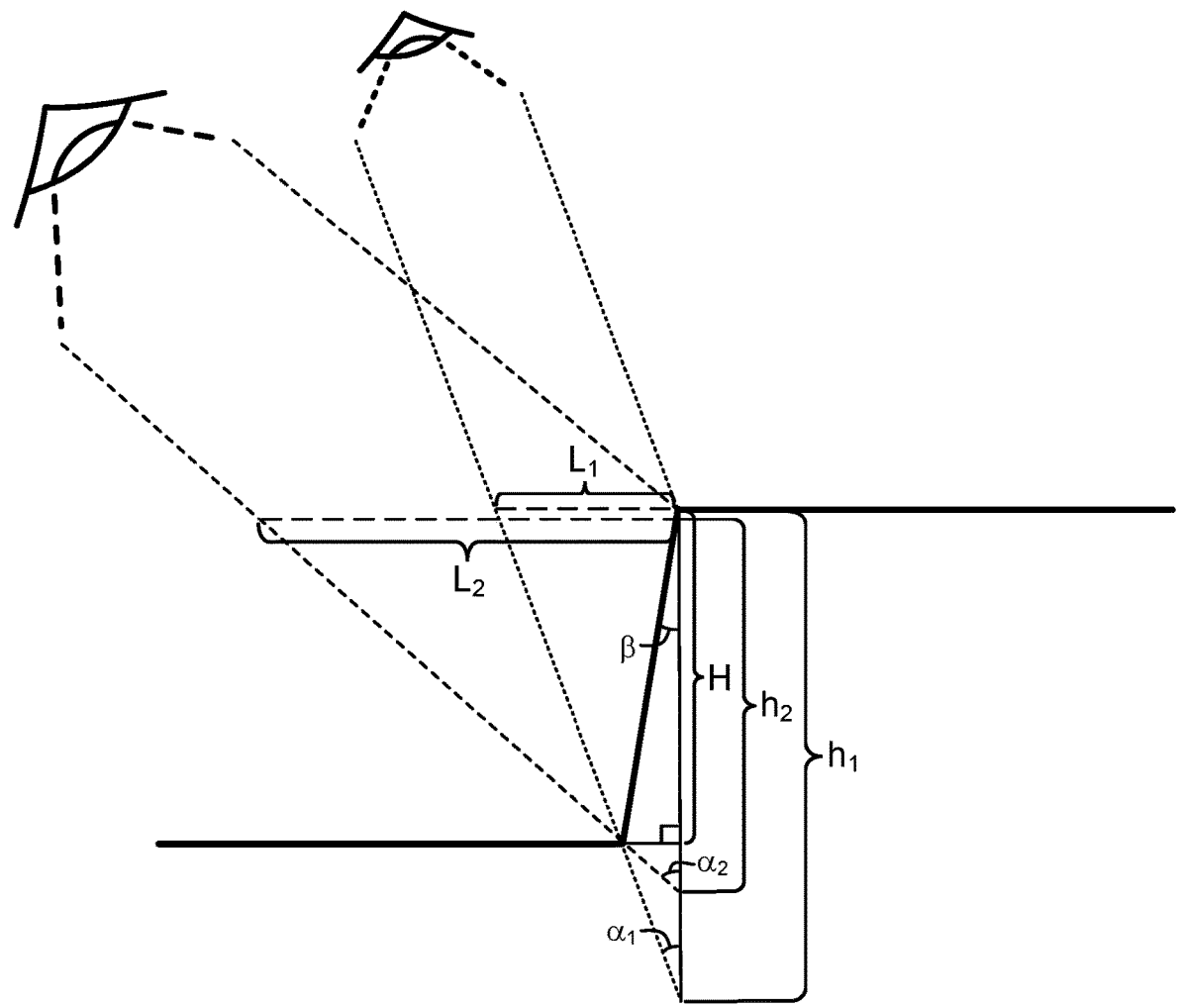
FIG. 8 is a simplified diagram illustrating how a vertical thickness of a buried layer can be determined according to an embodiment.

FIG. 8 is a simplified diagram illustrating how a vertical thickness of a buried layer can be determined according to an embodiment. For ease of illustration, upper and lower surfaces of the buried layer are represented in this figure by horizontal lines. The horizontal lines are connected by a line representing the sidewall of the buried layer that is sloped at an angle $\beta$ from the vertical. In this example, a first image of the sidewall is obtained from a first perspective at a first tilt angle $\alpha_1$, and a second image is obtained from a second perspective at a second tilt angle $\alpha_2$. The tilt angles $\alpha_1$ and $\alpha_2$ may be user defined and/or may be obtained from or determined by the imaging device. The vertical thickness of the buried layer is represented by H.

When analyzing features from a titled perspective, most conventional SEM imaging devices measure distance projected onto a horizontal or vertical plane. As an example, in FIG. 8 the distance projected onto the horizontal plane from the first perspective is $L_1$, and the distance projected onto the vertical plane from the first perspective is $h_1$. Similarly, the distance projected onto the horizontal plane from the second perspective is $L_2$, and the distance projected onto the vertical plane from the second perspective is $h_2$. In accordance with an embodiment, the these measured distances may be used along with the tilt angles $\alpha_1$ and $\alpha_2$ to determine the vertical thickness of the buried layer H using either of the following equations:

$$H = \frac{L2 - L1}{\tan(\alpha 2) - \tan(\alpha 1)} \quad (1)$$

$$H = \frac{h2\tan(\alpha 2) - h1\tan(\alpha 1)}{\tan(\alpha 2) - \tan(\alpha 1)} \quad (2)$$

In some embodiments, the first perspective may be approximately top-down (normal to a surface of the sample), and the second perspective may be approximately 45° to the surface of the sample. In this configuration, the vertical thickness H of the buried layer may be determined using the equation:

$$H = L2 - L1 \quad (3)$$

Figure 9:
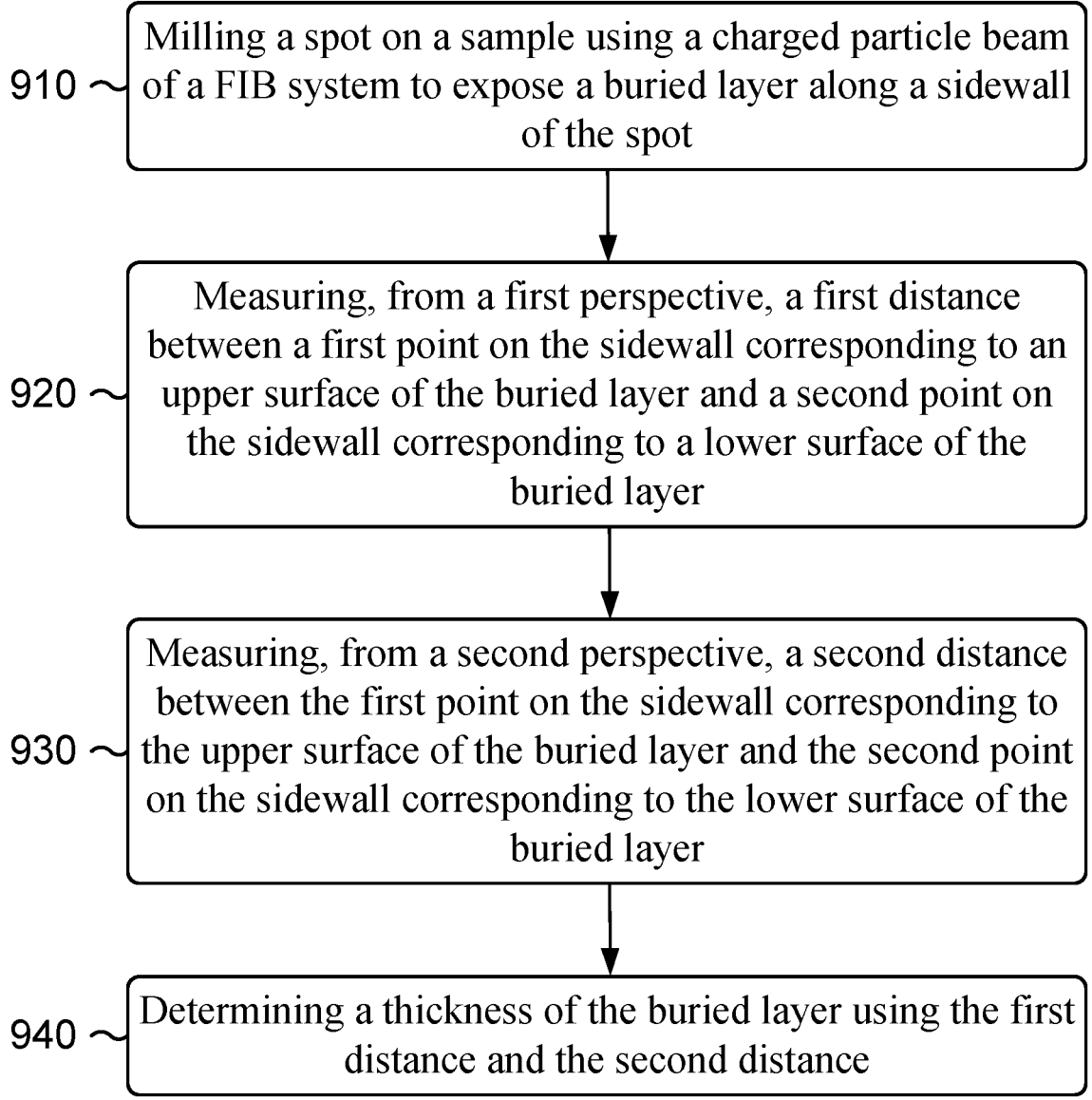
FIGS. 9-10 are flowcharts of exemplary methods for determining a thickness of a buried layer on a sample according to some embodiments.
Figure 10:
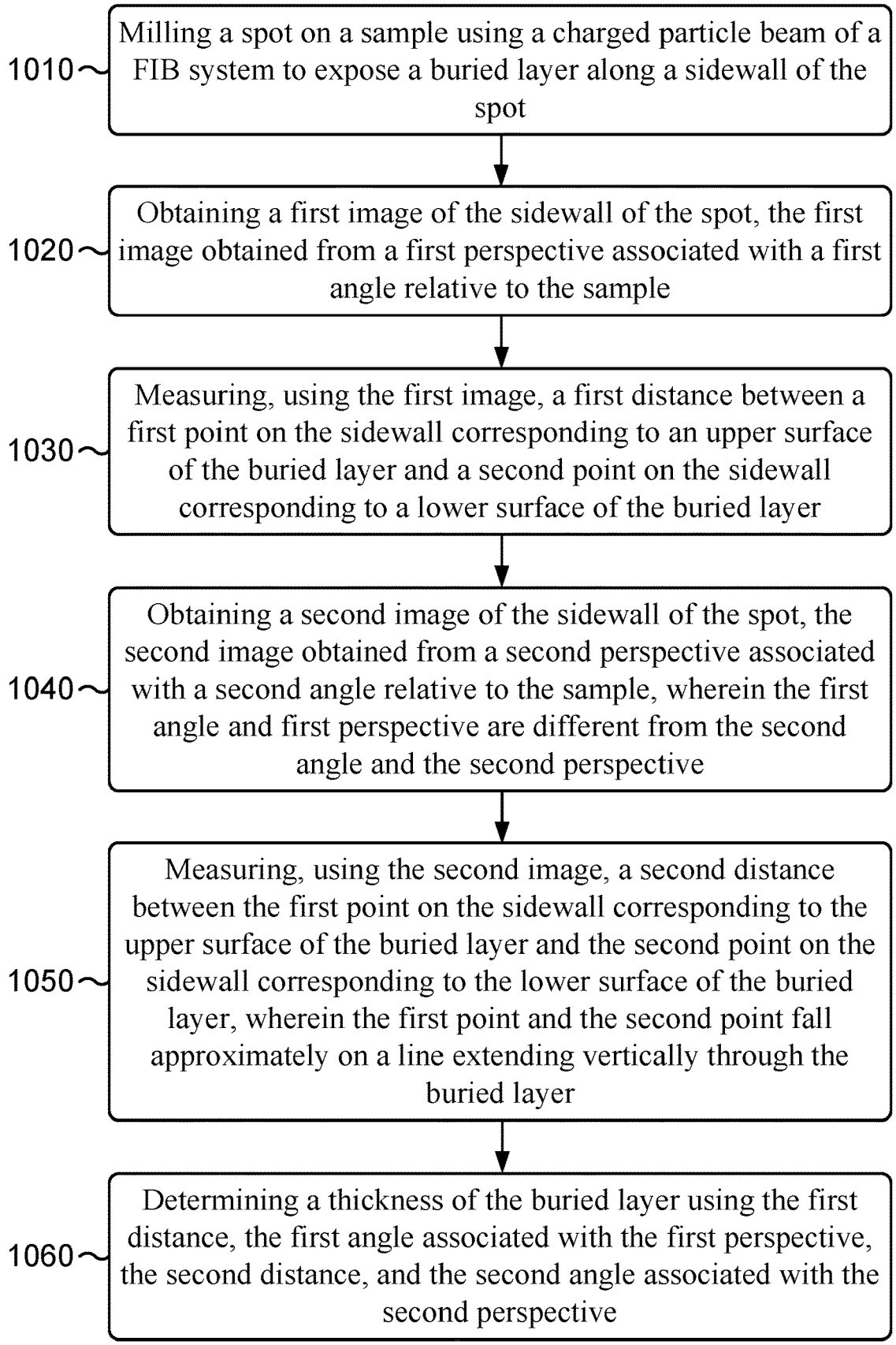

FIGS. 9-10 are flowcharts of exemplary methods for determining a thickness of a buried layer on a sample according to some embodiments. The example of FIG. 9 includes milling a spot on a sample using a charged particle beam of a FIB system to expose a buried layer along a sidewall of the spot (910). The spot may be milled without scanning the charged particle beam, and the sidewall of the spot may be sloped after the milling. In some embodiments, the sample is a semiconductor wafer.

The method also includes measuring, from a first perspective, a first distance between a first point on the sidewall corresponding to an upper surface of the buried layer and a second point on the sidewall corresponding to a lower surface of the buried layer (920). In some embodiments, the first perspective may be approximately normal to a surface of the sample, although the first perspective may also be tilted.

The method also includes measuring, from a second perspective, a second distance between the first point on the sidewall corresponding to the upper surface of the buried layer and the second point on the sidewall corresponding to the lower surface of the buried layer (930). In some embodiments, an angle of the second perspective may be approximately 45° to the surface of the sample, although the second perspective may be tilted at another angle. The first perspective and the second perspective are at different angles relative to a surface of the sample. As explained with regard to FIG. 6a, the first point and the second point may fall approximately on a line extending vertically through the buried layer.

The method also includes determining a thickness of the buried layer using the first distance and the second distance (940). The thickness of the buried layer is a vertical distance between the upper surface of the buried layer and the lower surface of the buried layer. The first distance may be measured using a first image of the sidewall, and the second distance may be measured using a second image of the sidewall. The thickness of the buried layer may be used to monitor a fabrication process. The fabrication process may be, for example, a film deposition or etch process.

The example of FIG. 10 includes milling a spot on a sample using a charged particle beam of a FIB system to expose a buried layer along a sidewall of the spot (1010). The spot may be milled without scanning the charged particle beam, and after the milling, the sidewall of the spot may be sloped.

The method also includes obtaining a first image of the sidewall of the spot, the first image obtained from a first perspective associated with a first angle relative to the sample (1020), and measuring, using the first image, a first distance between a first point on the sidewall corresponding to an upper surface of the buried layer and a second point on the sidewall corresponding to a lower surface of the buried layer (1030).

The method also includes obtaining a second image of the sidewall of the spot, the second image obtained from a second perspective associated with a second angle relative to the sample, wherein the first angle and first perspective are different from the second angle and the second perspective (1040), and measuring, using the second image, a second distance between the first point on the sidewall corresponding to the upper surface of the buried layer and the second point on the sidewall corresponding to the lower surface of the buried layer, wherein the first point and the second point fall approximately on a line extending vertically through the buried layer (1050). The first angle associated with the first perspective and the second angle associated with the second perspective may be relative to a surface of the sample.

The method also includes determining a thickness of the buried layer using the first distance, the first angle associated with the first perspective, the second distance, and the second angle associated with the second perspective (1060).

It should be appreciated that the specific steps illustrated in FIGS. 9-10 provide particular methods for determining a thickness of a buried layer according to some embodiments. Other sequences of steps may also be performed according to alternative embodiments. For example, alternative embodiments may perform the steps outlined above in a different order. Moreover, the individual steps illustrated in FIGS. 9-10 may include multiple sub-steps that may be performed in various sequences. Furthermore, additional steps may be added or removed depending on the particular application.

Also, configurations may be described as a process which is depicted as a schematic flowchart or block diagram. Although each may describe the operations as a sequential process, many of the operations can be performed in parallel or concurrently. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

While the foregoing is directed to specific embodiments, other and further embodiments may be devised without departing from the basic scope thereof. For example, features of one or more embodiments of the invention may be combined with one or more features of other embodiments without departing from the scope of the invention. The specification and drawings are, accordingly, to be regarded in an illustrative rather than a restrictive sense. Thus, the scope of the present invention should be determined not with reference to the above description, but should be determined with reference to the appended claims along with their full scope of equivalents.

What is claimed is:

1. An inspection system for analyzing a buried layer of a sample, comprising:
   a focused ion beam (FIB) column;
   a scanning electron microscopy (SEM) column; and
   a computer readable medium comprising instructions that when executed cause the inspection system to perform steps comprising:
      milling a spot on the sample using a charged particle beam of the FIB column to expose the buried layer along a sidewall of the spot, wherein after the milling the sidewall of the spot is sloped;
      obtaining a first image of the sidewall of the spot using the SEM column, the first image obtained from a first perspective associated with a first angle relative to a surface of the sample;
      measuring, using the SEM column, a first distance between a first point on the sidewall corresponding to an upper surface of the buried layer and a second point on the sidewall corresponding to a lower surface of the buried layer, wherein the first distance is projected onto a horizontal plane or a vertical plane;
      obtaining a second image of the sidewall of the spot using the SEM column, the second image obtained from a second perspective associated with a second angle relative to the surface of the sample;
      measuring, using the SEM column, a second distance between the first point on the sidewall corresponding to the upper surface of the buried layer and the second point on the sidewall corresponding to the lower surface of the buried layer, wherein the second distance is projected onto the horizontal plane or the vertical plane, and the first point and the second point fall approximately on a line extending vertically through the buried layer; and
      determining a thickness of the buried layer using the first angle, the first distance, the second angle, and the second distance.

2. The inspection system of claim 1 wherein the thickness of the buried layer is a vertical distance between the upper surface of the buried layer and the lower surface of the buried layer.

3. The inspection system of claim 1 wherein the first angle is approximately normal to the surface of the sample, and the second angle is approximately 45° to the surface of the sample.

4. The inspection system of claim 1 wherein the line extending vertically through the buried layer is approximately normal to the upper surface of the buried layer or the lower surface of the buried layer.

5. The inspection system of claim 1 wherein the computer readable medium further comprises instructions that when executed cause the inspection system to mill the spot with the charged particle beam in a focused mode.

6. The inspection system of claim 1 wherein the computer readable medium further comprises instructions that when executed cause the inspection system to mill the spot with the charged particle beam in a de-focused mode.

7. The inspection system of claim 1 wherein the computer readable medium further comprises instructions that when executed cause the inspection system to mill the spot without scanning the charged particle beam.

8. The inspection system of claim 1 wherein the charged particle beam of the FIB column is generated using a plasma xenon source.

9. A method of analyzing a buried layer on a sample, the method comprising:
   milling a spot on the sample using a charged particle beam of a focused ion beam (FIB) column to expose the buried layer along a sidewall of the spot, wherein the spot is milled without scanning the charged particle beam, and after the milling, the sidewall of the spot is sloped;
   obtaining a first image of the sidewall of the spot, the first image obtained from a first perspective associated with a first angle relative to the sample;
   measuring, using the first image, a first distance between a first point on the sidewall corresponding to an upper surface of the buried layer and a second point on the sidewall corresponding to a lower surface of the buried layer;
   obtaining a second image of the sidewall of the spot, the second image obtained from a second perspective associated with a second angle relative to the sample, wherein the first angle and first perspective are different from the second angle and the second perspective;
   measuring, using the second image, a second distance between the first point on the sidewall corresponding to the upper surface of the buried layer and the second point on the sidewall corresponding to the lower surface of the buried layer, wherein the first point and the second point fall approximately on a line extending vertically through the buried layer; and determining a thickness of the buried layer using the first distance, the first angle associated with the first perspective, the second distance, and the second angle associated with the second perspective.

10. The method of claim 9 wherein the first angle associated with the first perspective and the second angle associated with the second perspective are relative to a surface of the sample.

11. The method of claim 9 wherein the thickness of the buried layer is a vertical distance between the upper surface of the buried layer and the lower surface of the buried layer.

12. The method of claim 9 wherein the line extending vertically through the buried layer is approximately normal to the upper surface of the buried layer or the lower surface of the buried layer.

13. The method of claim 9 wherein the spot is milled with the charged particle beam in a focused mode.

14. The method of claim 9 wherein the spot is milled with the charged particle beam in a de-focused mode.

15. The method of claim 9 wherein the charged particle beam is generated using a plasma xenon source.

16. The method of claim 9 wherein the buried layer on the sample underlies an overlying layer on the sample.

17. The method of claim 9 wherein the sample is a semiconductor wafer.

18. The method of claim 9 wherein the first image and the second image are obtained using a scanning electron microscopy (SEM) technique.

19. The method of claim 9 wherein the first distance and the second distance are projected onto a horizontal plane or a vertical plane.

20. The method of claim 9 further comprising monitoring a fabrication process using the thickness of the buried layer.

* * * * *